United States Patent
Hoang et al.

(10) Patent No.: US 8,918,583 B2
(45) Date of Patent: Dec. 23, 2014

(54) ADAPTING BEHAVIOR OF SOLID-STATE DRIVE USING REAL USAGE MODEL

(71) Applicants: Pho Hoang, Foothill Ranch, CA (US); Jian Chen, Irvine, CA (US)

(72) Inventors: Pho Hoang, Foothill Ranch, CA (US); Jian Chen, Irvine, CA (US)

(73) Assignee: Virtium Technology, Inc., Rancho Santa Margarita, CA (US)

( * ) Notice: Subject to any disclaimer, the term of this patent is extended or adjusted under 35 U.S.C. 154(b) by 168 days.

(21) Appl. No.: 13/722,845

(22) Filed: Dec. 20, 2012

(65) Prior Publication Data

US 2014/0181363 A1 Jun. 26, 2014

(51) Int. Cl.
*G06F 12/02* (2006.01)
*G06F 11/34* (2006.01)

(52) U.S. Cl.
CPC ...... *G06F 12/0246* (2013.01); *G06F 2212/214* (2013.01); *G06F 11/3447* (2013.01); *G06F 11/3409* (2013.01)
USPC ...... 711/103; 711/156; 711/158; 365/185.33; 714/22; 714/47.1; 713/320; 713/340; 703/2; 324/76.11

(58) Field of Classification Search
CPC .......... G06F 12/0246; G06F 2212/214; G06F 11/3409; G06F 11/3447
USPC ........ 711/103, 156, 158; 365/185.33; 714/22, 714/47.1; 713/320, 340; 703/2; 324/76.11
See application file for complete search history.

(56) References Cited

U.S. PATENT DOCUMENTS

| | | | | |
|---|---|---|---|---|
| 8,086,819 B2 * | 12/2011 | Thomas et al. | ............... | 711/172 |
| 8,117,280 B2 * | 2/2012 | Masuouka et al. | ............ | 709/218 |
| 8,499,025 B2 * | 7/2013 | Howard | ........................ | 709/201 |
| 8,549,247 B2 * | 10/2013 | Satoyama et al. | ............ | 711/165 |
| 2009/0094433 A1 * | 4/2009 | Thomas et al. | ............... | 711/172 |
| 2009/0141587 A1 * | 6/2009 | Welker et al. | ................... | 367/16 |
| 2010/0185719 A1 * | 7/2010 | Howard | ........................ | 709/201 |
| 2011/0179132 A1 * | 7/2011 | Mayo et al. | ................... | 709/213 |
| 2011/0286302 A1 * | 11/2011 | Welker et al. | ................... | 367/16 |
| 2011/0305293 A1 * | 12/2011 | Choi et al. | ..................... | 375/285 |
| 2012/0246388 A1 * | 9/2012 | Hashimoto | ................... | 711/103 |
| 2013/0067148 A1 * | 3/2013 | Takagi et al. | ................. | 711/103 |
| 2014/0059277 A1 * | 2/2014 | Chung | ......................... | 711/103 |
| 2014/0181595 A1 * | 6/2014 | Hoang et al. | ................. | 714/47.3 |

* cited by examiner

*Primary Examiner* — Stephen Elmore

(57) ABSTRACT

An embodiment is a technique to adapt behavior of a solid-state drive (SSD) to extend lifespan of the SSD. Real environmental information is received from an environmental processor. The real environmental information corresponds to an environment of the SSD. A behavior model is selected based on a real environmental model and an internal data usage model. If a new behavior model is selected, the environmental processor is informed about the new behavior model. The environmental processor sends control commands to a power management module to apply new power policy to the SSD. Information on the new behavior model is made available for query. If current behavior model is selected, the current behavior model is maintained.

11 Claims, 15 Drawing Sheets

ADAPTING BEHAVIOR OF SOLID-STATE DRIVE USING REAL USAGE MODEL

TECHNICAL FIELD

The presently disclosed embodiments are directed to the field of solid-state drive (SSD), and more specifically, to real usage environment for SSD.

BACKGROUND

Solid-state drives (SSDs) using flash memory devices (e.g., NAND flash devices) have become increasingly popular in data storage for computer systems, enterprise systems, mobile devices, consumer devices (e.g., cameras). The SSDs are now replacing the hard disk drives (HDDs) in many applications. Compared to the HDDs, the main advantages of the SSDs may include superior speed performance, usually measured by Input/Output Operations Per Second (IOPS), small form factors, and quietness. The disadvantages of the SSDs may include price, capacity, and availability. Since SSDs represent a newer technology, there may be issues that are not well understood or controlled in SSDs compared to HDDs. Examples of these issues may include reliability, failures, and endurance.

While SSDs have no moving parts compared to HDDs, there are several problems with SSDs that may affect reliability, failures, and endurance. These problems may include limited write cycles, wear leveling, Error Correcting Code (ECC) for data retention, page remapping, garbage collection (GC), write caching, managing internal mapping tables, etc. In many applications, it is important to be able to estimate the lifespan of the SSDs, predict the failures, or maximize the lifespan of the SSDs.

SUMMARY

One disclosed feature of the embodiments is a technique to adapt behavior of a solid-state drive (SSD) to extend lifespan of the SSD. Real environmental information is received from an environmental processor. The real environmental information corresponds to an environment of the SSD. A behavior model is selected based on a real environmental model and an internal data usage model. If a new behavior model is selected, the environmental processor is informed about the new behavior model. The environmental processor sends control commands to a power management module to apply new power policy to the SSD. Information on the new behavior model is made available for query. If current behavior model is selected, the current behavior model is maintained.

BRIEF DESCRIPTION OF THE DRAWINGS

Embodiments may best be understood by referring to the following description and accompanying drawings that are used to illustrate embodiments. In the drawings.

DETAILED DESCRIPTION

Figure 1:
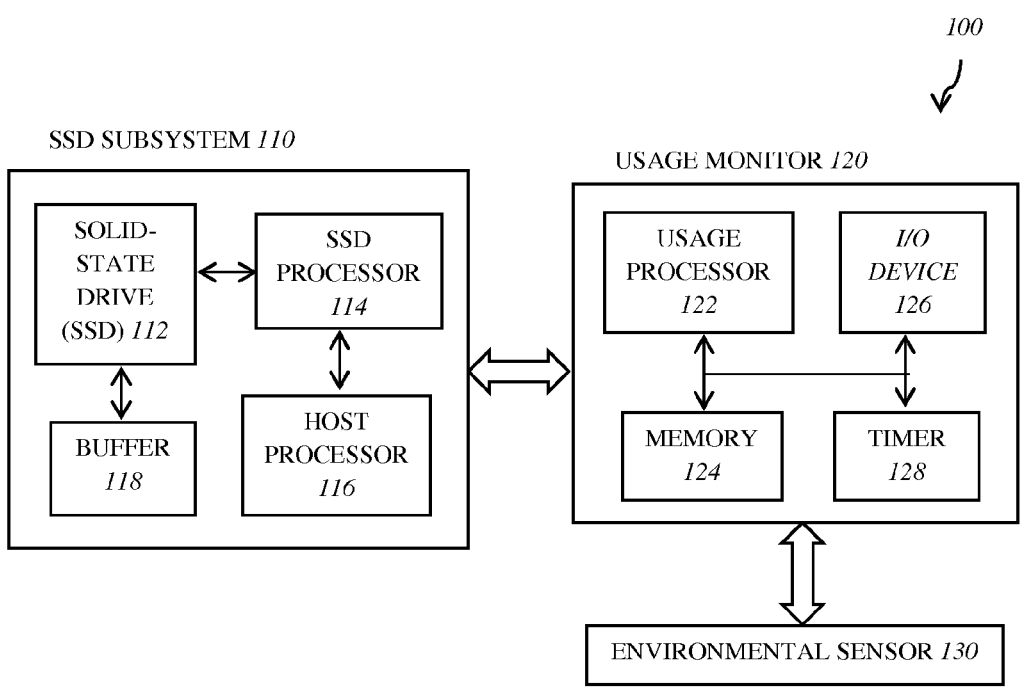
FIG. 1 is a diagram illustrating a system according to one embodiment.

One disclosed feature of the embodiments is a technique to adapt behavior of a solid-state drive (SSD) to extend lifespan of the SSD. Real environmental information is received from an environmental processor. The real environmental information corresponds to an environment of the SSD. A behavior model is selected based on a real environmental model and an internal data usage model. If a new behavior model is selected, the environmental processor is informed about the new behavior model. The environmental processor sends control commands to a power management module to apply new power policy to the SSD. Information on the new behavior model is made available for query. If current behavior model is selected, the current behavior model is maintained.

In another embodiment, a set of optimal SSD operations is derived corresponding to a model environment and a model usage of the SSD in a real usage model. The real usage model is created from an environmental profile, a usage profile, and an initial usage model. An environmental parameter representative of a current environment and an usage parameter representative of a current usage of the SSD are obtained. A match is asserted if the current environment and the current usage match with the model environment and the model usage, respectively. Behavior of the SSD is adapted using the set of optimal SSD operations if the match is asserted.

In the following description, numerous specific details are set forth. However, it is understood that embodiments may be practiced without these specific details. In other instances, well-known circuits, structures, and techniques have not been shown to avoid obscuring the understanding of this description.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

The basis of the embodiments is the observation that there are different applications using the SSDs where each system or application has its own objectives, requirements, and environment. Because of this, a generic usage model of the SSD is inadequate in characterizing the operational parameters in the system. Accordingly, a real usage model that reflects the actual operational nature and/or the environment of a system may be more appropriate. In addition, while different applications have different operational parameters and/or environments, each of these applications typically follow a certain common pattern of usage particularized to the environment in which the SSD is used. For example, a database system may have transactions that follow a fairly fixed pattern: start the transaction, execute a set of data manipulations and/or queries, commit the transaction if there are no errors, roll back the transaction if there are errors. In each of these operations, the usage of the SSD in the system may also follow a fixed pattern. For example, a query operation may involve a series of read cycles, an update may involve a series of write cycles, etc. In addition, these operations may occur with frequencies in accordance to external factors such as time. A back-up operation usually takes place at night or when there are few users on the system. Moreover, the physical location of the SSD system may also reflect the usage of the SSD. For example, an embedded system that directs traffic in a mountainous area may have different usage than the same system operating in a city. A real usage model for an SSD, therefore, does not merely depend on how the SSD is used, but also where the SSD is used.

FIG. 1 is a diagram illustrating a system 100 according to one embodiment. The system 100 may include an SSD subsystem 110, a usage monitor 120, and an environmental sensor 130. The system 100 may include more or less than the above components. For example, part of the usage monitor 120 may be integrated within the SSD subsystem 110. In addition, any of these components may be implemented in hardware, software, firmware, or any combination of hardware, software, and firmware.

The SSD subsystem 110 is a subsystem that employs the SSD. It may include an SSD 112, an SSD processor 114, a host processor 116, and a buffer 118. It may include more or less than the above components. For example, it may include I/O devices, display unit, keyboard, memory, other mass storage media, etc.

The SSD 112 may include a number of flash devices. Each of the flash devices may be any semiconductor flash memory device such as a NAND flash memory, a NOR flash memory. It may be a single die or a multiple die device. It may be a single level cell (SLC) or multiple level cell (MLC) device. Each of the flash devices in the SSD 112 may be organized in any configurations, such as 512 Mb to 128 Gb density, block size from 16K to 512K, page size from 512 to 8K, etc. The SSD 112 may be accessed by the SSD processor 114 or the host processor 116. It is desired to obtain a real usage model of the SSD 112 so that estimates of failures or lifespan may be performed.

The SSD processor 114 may be any processor that is designed to control the SSD 112 and act as the interface between the SSD 112 and the host processor 116. The SSD processor 114 may also have interface to the usage monitor 120 to send commands to, or receive sensing data from, the usage monitor 120. The SSD processor 114 may be a flash controller or SSD controller that controls the flash device 130 and has standard control features or functionalities including error correcting code (ECC) and data scrambling and descrambling. The SSD 120 may have flash interface that may connect to multiple flash devices. It may have Direct Memory Access (DMA) and encryption/decryption engines. It may have a number of interfaces including Serial AT Attachment (SATA), Small Computer Small Interface (SCSI), Serial Attachment SCSI (SAS), Integrated Drive Electronics (IDE), enhanced IDE, Universal Serial Bus (USB), Fiber Channel (FC), etc. It may support Self-Monitoring, Analysis, and Reporting Technology (SMART) commands. In general, the SSD processor 114 may perform a number of operations in the control of the SSD 112. Many of these operations are commanded by the host processor 116. Some of these operations are internal to the SSD processor 114.

The host processor 114 may be any processor that is at the host level. It may be a general-purpose microprocessor, a special-purpose processor, or a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. The host processor 114 may have interface to communicate with the SSD processor 114 and/or the usage monitor 120. It may also have interfaces to other devices or subsystems including I/O devices, mass storage device, display unit, network device, etc.

The buffer 118 may be a memory external or internal to the SSD 112. It may be a temporary memory that buffers the data to be written to the SSD 112 to reduce the write traffic to the SSD 112. For example, one technique called "Write Coalescing" may be used to provide write efficiency. It involves gathering several short writes to adjacent SSD sectors to turn them into a single long write from the buffer into the NAND flash in the SSD 112. It may also be used to buffer data in a page-length size before actual writing to the SSD 112.

The usage monitor 120 may be coupled to the SSD subsystem 110, including the SSD processor 114 and/or the host processor 116, and the environmental sensor 130 to provide real usage environment information. The usage monitor 120 includes a usage processor 122, a memory 124, an I/O device 126, and a timer 128. The usage monitor 120 may include more or less than the above components.

The usage processor 122 may be any type of processor. In one embodiment, it may be highly integrated processor that has small footprint and consumes very low power. It may be a low-power micro-controller with integrated peripherals including digital and analog peripherals. It may have ability to perform analog processing on signals received from the environmental sensor 130 such as signal conditioning, filtering, modulation, etc. It may have a timer, a watchdog timer, internal and external oscillators. It may have on-board memory including random access memory (RAM), non-volatile memory such as Ferroelectric RAM (FRAM). The memory 124 may be optional if the usage processor 122 has its own memory. The memory 124 or the memory in the usage processor 122 may store instructions that, when executed by the usage processor 122, cause the usage processor 122 to perform operations described in the following. The I/O device 126 may provide I/O functions such as communication (wired and/or wireless). It may be optional if the usage processor 122 has the desired I/O functionalities. The timer 128 may be optional if the usage processor 122 has the desired timing functionality. The timer 128, either external or internal to the usage processor 122, provides timing information. The usage processor 122 may communicate with the SSD processor 114 or the host processor 116 via any suitable communication interface including serial, parallel, or wireless. Examples may include the Inter-Integrated Circuit ($I^2C$) serial interface, the 802.11 or Bluetooth wireless interface.

The usage processor 122 may perform operations that are related to the real usage model including creating the real usage model, failure prediction and/or analysis, and maximizing lifespan of the SSD 112. By delegating these tasks to the usage processor 122, the SSD processor 114 or the host processor 116 may be relieved of burden of performing these tasks. As discussed above, the tasks related to the real usage model may be performed exclusively by the usage processor 122 or shared among the usage processor 122, the SSD processor 114, and the host processor 116. For example, the usage processor 122 may be responsible for processing the environmental data; the SSD processor 114 may be responsible for processing SSD operations; and the host processor 116 may be responsible for processing SMART commands or other host-level tasks.

The environmental sensor 130 may be a single sensor or a set of several sensors of the same type or of different types. The sensor or sensors may be located at any locations suitable for the creation of the real usage model. It may be an environmental sensor being at least one of a temperature sensor, a humidity sensor, a pressure sensor, and an illuminance sensor. Among the various types of environmental sensor, temperature may provide the most significant parameter—temperature—because ambient temperature typically has the most impact on the SSD 112. Other environmental sensing data may not have significant impact on the SSD 112 but they reflect the actual environment and therefore may be useful in characterizing the actual operational environment of the SSD 112. The following example illustrates the usefulness of environmental data in a real usage environment. A system employing the SSD 112 may be used at several locations during its lifetime. The system may have several different sets of SSD operations according to its location. Initially, it may be left at a high altitude location having low pressure to collect and analyze atmospheric data. The pressure sensor may be useful to indicate that the SSD is being used in low pressure environment. Accordingly, the data collected during this time, such as the SSD operations, may be valid only for low pressure environment. When the system is moved to another location, say, in the desert, to monitor earthquake activities with a different set of SSD operations, the model created during the low pressure environment may no longer be valid. Subsequently, the system is moved to a high altitude location again. At this location, the data previously collected may then be retrieved to provide more accurate predictions.

The usage monitor 120 collects the environmental sensing data from the environmental sensor 130. The environmental sensor 130 may be at least one of a temperature sensor, a humidity sensor, a pressure sensor, and an illuminance sensor. The usage monitor 120 then transmits the environmental sensing data to the SSD processor 114.

Figure 2:
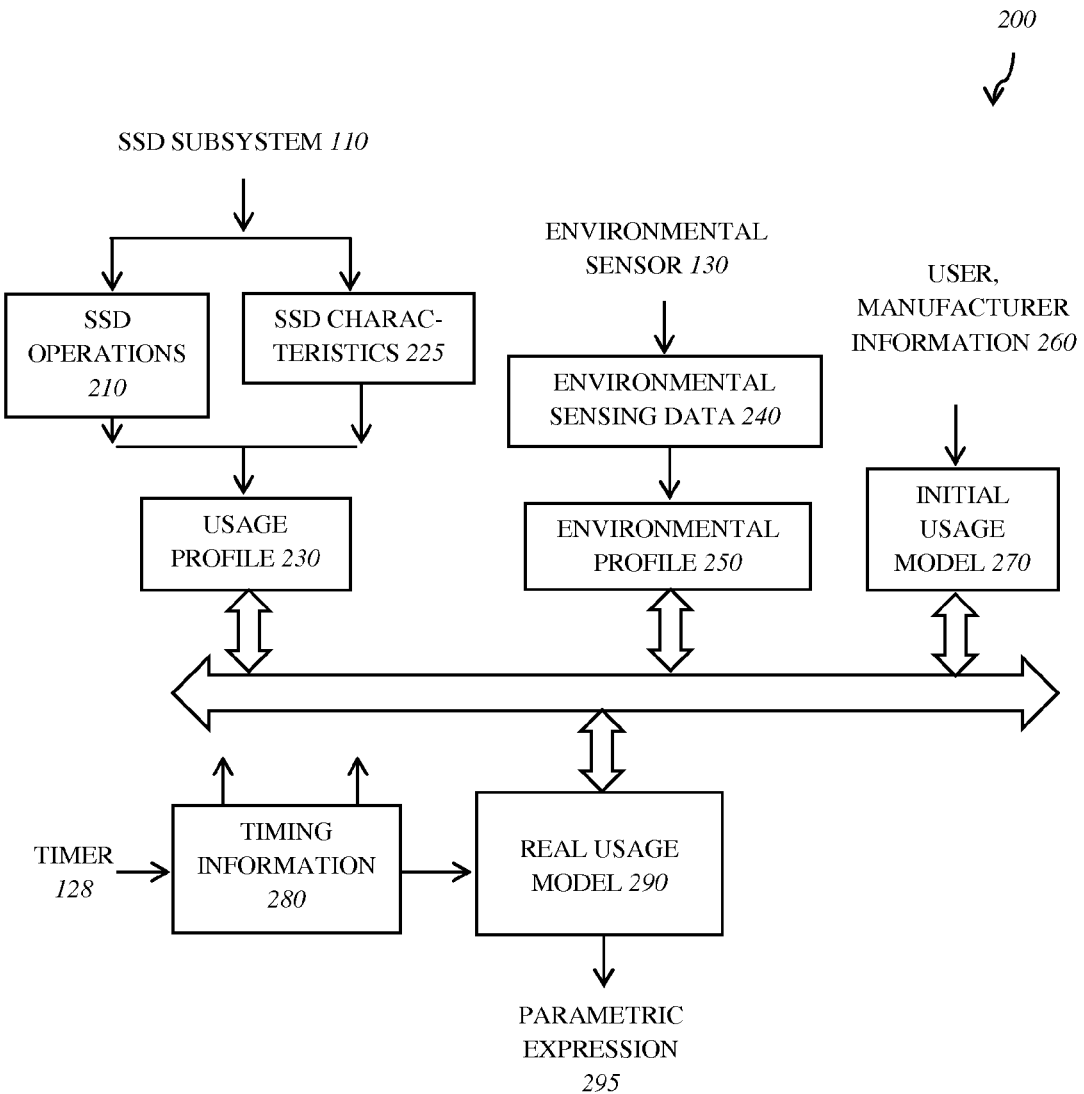
FIG. 2 is a diagram illustrating an information flow according to one embodiment.

FIG. 2 is a diagram illustrating an information flow 200 according to one embodiment. The information flow 200 starts with the information or data provided by the SSD subsystem 110, the environmental sensor 130, user and/or manufacturer information 260, and the timer 128. By collecting some or all of the above information, the SSD processor 114 and the usage processor 122 may be able to analyze the usage data and create a real usage model 290 that reflects the actual operational environment of the SSD 112. From the real usage model 290, intelligent decisions or results may be obtained such as predicting failures, adapting behavior of the SSD subsystem 110 to the environment to lengthen or maximize the lifespan of the SSD 112. The real usage model 290 may be created from a usage profile 230, an environmental profile 250, and optionally an initial usage model 270. The timer 128 provides timing information 280 that may be used in creating the real usage model 290.

The SSD subsystem 110 provides usage information on the SSD 112. This information includes SSD operations 210 and SSD characteristics 225. The SSD operations 210 include all operations performed on the SSD 112. The SSD operations may include at least one of garbage collection, wear leveling, program/erase (P/E) cycle, read cycle, write cycle, ECC computation, external data processing, over-provisioning, bad block mapping, TRIM command, and write amplification. These are merely illustrative examples of the SSD operations. Other operations may be specified. In general, the SSD operations are those operations that may have an impact of the failure, reliability, or lifespan of the SSD 112. The SSD characteristics 225 may provide characteristics of the SSD 112. These characteristics may include type and manufacturer of the flash devices used in the SSD 112, type of ECC algorithms, type of encryption, power consumption, operating voltages, rated performance (e.g., uncorrected bit error rate, endurance), compliance, type and size of internal buffer, etc.

The SSD operations 210 and SSD characteristics 225 may be used to provide a usage profile 230. The usage profile 230 provides information on how the SSD 112 has been used in the system. The information is represented in an easy-to-use form so that it may be incorporated into an analytic expression as part of the real usage model. For example, statistics (e.g., average number of writes/read/erasures/over a timing unit) of the SSD operations may be collected. The usage profile 230 may be subsequently combined with the environmental profile 250 and the initial usage model 270 to generate the real usage model 290.

The environmental sensor 130 provides environmental sensing data 240 that may be collected during the SSD operations. From the environmental sensing data 240, the environmental profile 250 may be constructed. The environmental profile 250 may then be combined with the usage profile 230 and optionally the initial usage model 270 to create the real usage model 290.

The initial usage model 270 represents the initial usage of SSD 112 using information from the user or the manufacturer. The user may enter information on how the SSD 112 may be used, such as the data rate requirements, the environment, etc. The manufacturer may provide pre-configured usage models to be selected by the user or set as default. The pre-configured initial usage model may represent the normal usage model that the manufacturer expects the SSD 112 is used under normal conditions. The manufacturer may also provide several initial usage models and the user may select the model that best represents the user's application. Deviations from the initial usage model may be determined and incorporated into the real usage model 290.

The real usage model 290 may be represented by a number of ways. It may be represented by a set of tables of usage parameters (e.g., average number of writes, reads) and the corresponding environment. It may also be represented by a parametric expression 295, or a set of equations or expressions, as basis for failure prediction or behavior adaptation. The real usage model 290 may be created when sufficient usage and environmental information has been collected and analyzed. It may be updated when the usage profile 230 or the environmental profile 250 has been changed significantly.

This may be quantitative characterized by computing a correlation factor. When this correlation factor exceeds a pre-defined threshold, it signals a change in the SSD usage or the environment to the extent that the real usage model needs to be updated.

Figure 3:
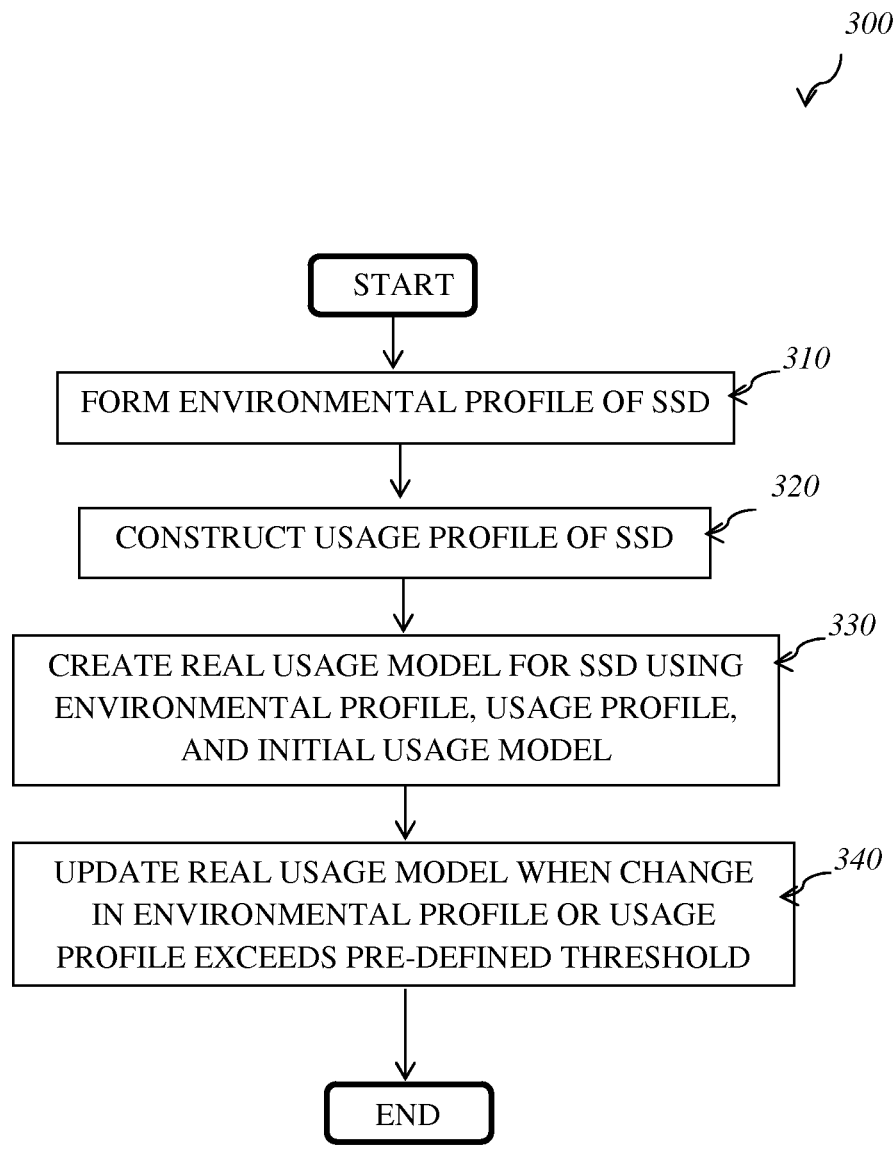
FIG. 3 is a flowchart illustrating a process to create a real usage model according to one embodiment.

FIG. 3 is a flowchart illustrating a process 300 to create a real usage model according to one embodiment.

Upon START, the process 300 forms an environmental profile of a solid-state drive (SSD) (Block 310). The environmental profile represents the characteristics of the environment that the SSD is operating. It may include temperature, pressure, humidity, luminance, or any other environmental information that may have an impact on the operation of the SSD or its performance. The environmental profile may be a table recording the sensing data over time. It may also be an equation that represents the sensing data as a function of time. The equation may be constructed using a curve-fitting technique using the data collected over time. The form of the equation may be linear or non-linear. An example is a polynomial equation, given in the following:

$$f(t) = a_0 + a_1 t + a_2 t^2 + a_3 t^3 + \ldots a_{N-1} t^{N-1} \tag{1}$$

where $f(t)$ is the environmental sensing data; $a_0, \ldots, a_{N-1}$ are real coefficients and $t$ is the time parameter.

Next, the process 300 constructs a usage profile of the SSD (Block 320). The usage profile of the SSD represents how the SSD is actually used. The usage of the SSD may be represented by a number of parameters. In one embodiment, these parameters include SSD operations, type of SSD, operation rate of the SSD operations, and operation frequency of the SSD operations. The usage profile may be represented by a set of tables that store these values. For dynamic values (e.g., SSD operations), they may be obtained during the active period of the SSD. These dynamic values may be indexed by any suitable index. One useful index is time. The SSD operations may include at least one of garbage collection, wear leveling, program/erase (P/E) cycle, read cycle, write cycle, ECC computation, external data processing, over-provisioning, bad block mapping, TRIM command, and write amplification. For example, the garbage collection operation may be represented as raw data of total number of garbage collections performed during a 24-hour period. It may also be represented by the statistics of the number of garbage collections performed over a time period. For example, average number of garbage collections in an hour. It may also be represented as a function of time in a similar manner as the environmental sensing data discussed above.

Then, the process 300 creates a real usage model for the SSD using the environmental profile, the usage profile, and an initial usage model (Block 330). The real usage model may include raw data stored in tables or expressed analytically in forms of equations. For example, the garbage collection parameter may be represented as a function of the environmental data. As an illustrative example, the average number of garbage collections may be expressed as a function of temperature.

Next, the process 300 updates the real usage model when a change in the environmental profile or the usage profile exceeds a pre-defined threshold (Block 340). This operation may be performed when the SSD experiences a significant change in usage or environment. The process 300 is then terminated.

Figure 4:
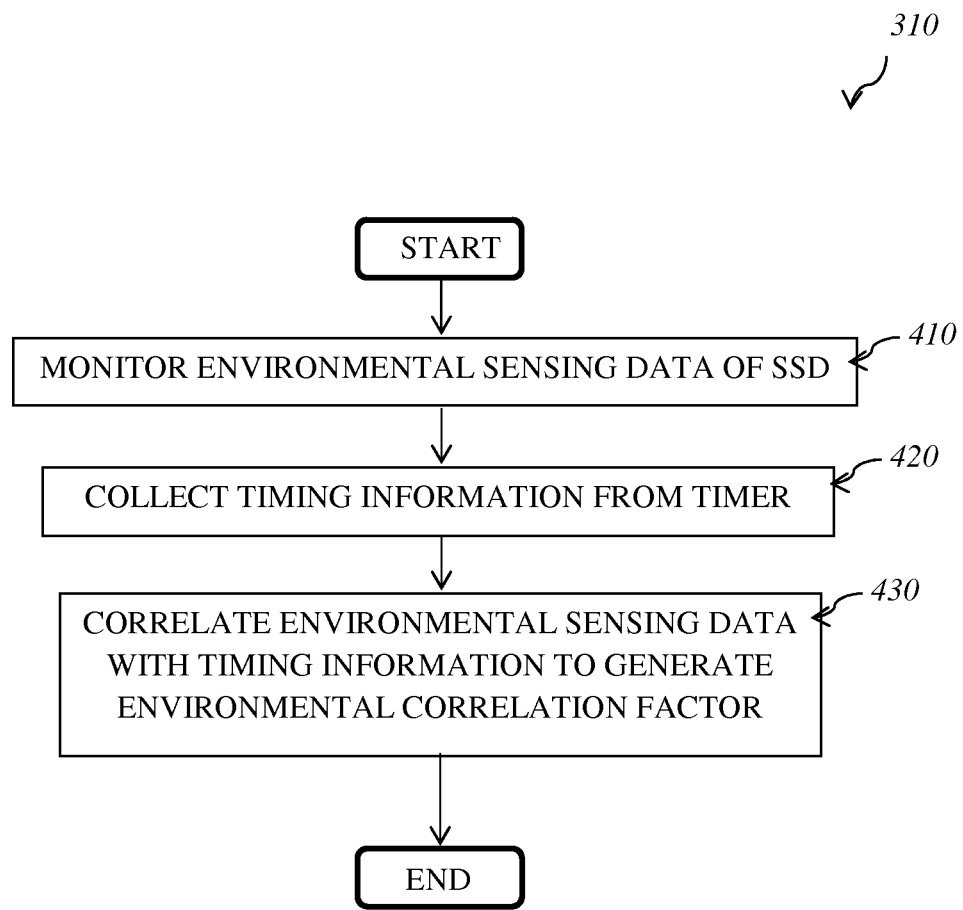
FIG. 4 is a flowchart illustrating a process to form an environmental profile according to one embodiment.

FIG. 4 is a flowchart illustrating the process 310 shown in FIG. 3 to form an environmental profile according to one embodiment.

Upon START, the process 310 monitors environmental sensing data of the SSD (Block 410). This task may be carried out by the usage processor 122. Next, the process 310 collects timing information from a timer (Block 420). The timing information may be collected or recorded at the time the environmental sensing data are being monitored. Then, the process 310 correlates the environmental sensing data with the timing information to generate an environmental correlation factor (Block 430). This correlation factor may be used to determine if the system is going through a significant change in its environment. The process 310 is then terminated.

Figure 5:
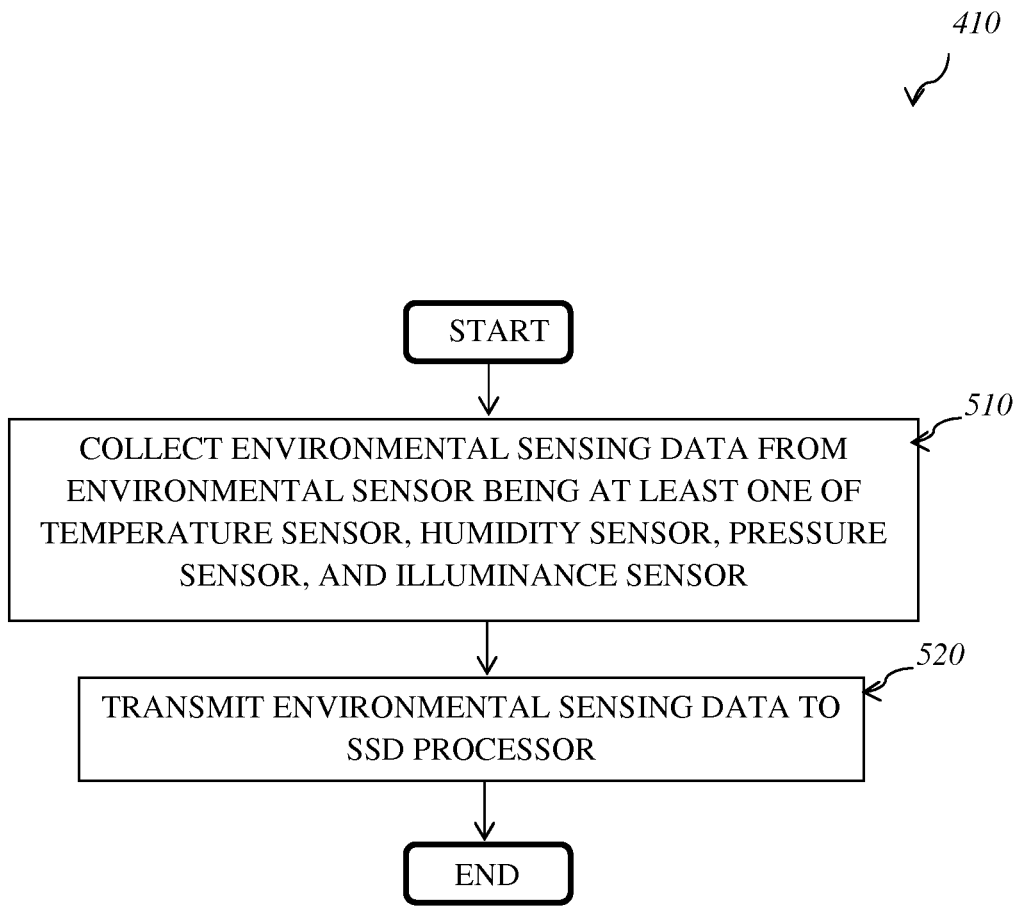
FIG. 5 is a flowchart illustrating a process to monitor environmental sensing data according to one embodiment.

FIG. 5 is a flowchart illustrating the process 410 shown in FIG. 4 to monitor environmental sensing data according to one embodiment.

Upon START, the process 410 collects the environmental sensing data from an environmental sensor being at least one of a temperature sensor, a humidity sensor, a pressure sensor, and an illuminance sensor (Block 510). Next, the process 410 transmits the environmental sensing data to an SSD processor (Block 520). The process 410 is then terminated.

Figure 6:
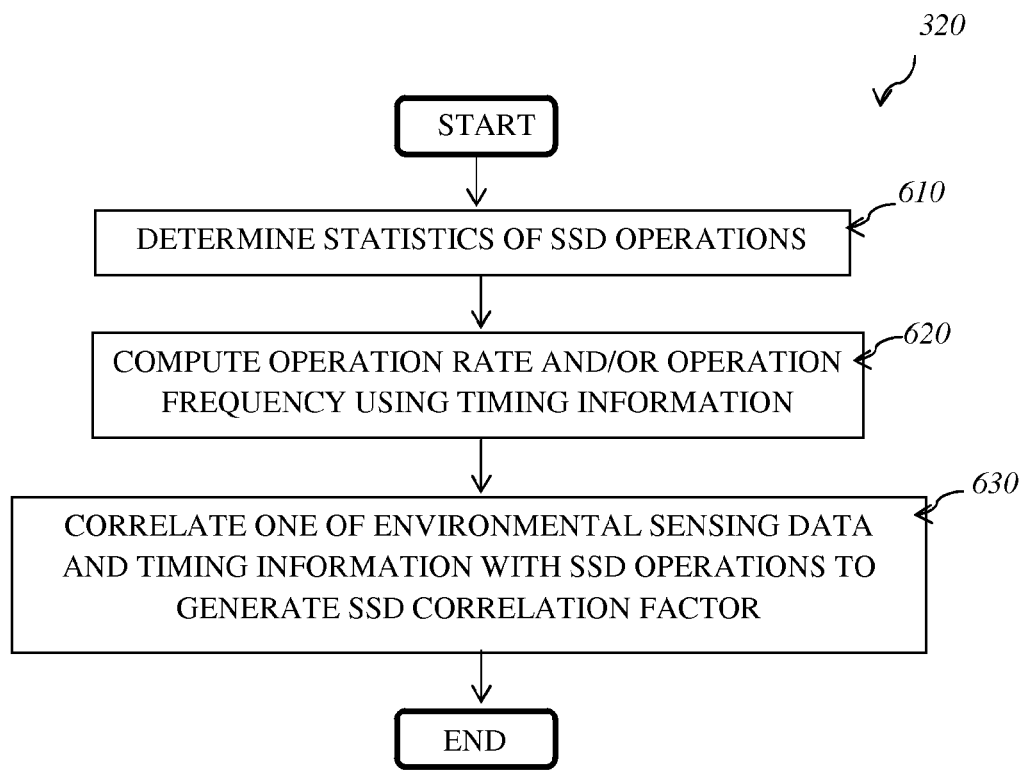
FIG. 6 is a flowchart illustrating a process to construct a usage profile of the SSD according to one embodiment.

FIG. 6 is a flowchart illustrating the process 320 shown in FIG. 3 to construct a usage profile of the SSD according to one embodiment. The usage profile of the SSD may include at least SSD operations, type of SSD, operation rate of the SSD operations, and operation frequency of the SSD operations.

Upon START, the process 320 determines statistics of the SSD operations (Block 610). The statistics provide a high-level summary of the SSD operations, such as the total number of writes, the average number of garbage collections over a time unit. Next, the process 320 computes the operation rate and/or the operation frequency using the timing information (Block 620). Then, the process 320 correlates one of the environmental sensing data and the timing information with the SSD operations to generate an SSD correlation factor (Block 630). This correlation factor may be used to determine if the system is going through a significant change in its usage. The process 320 is then terminated.

Figure 7:
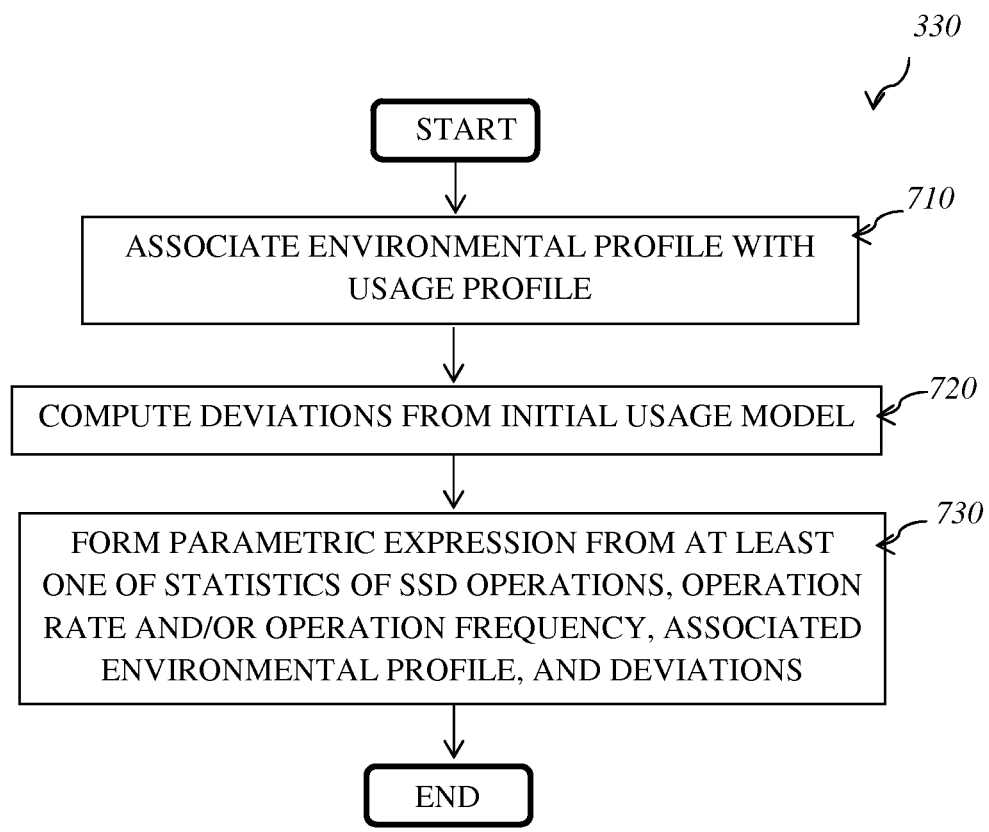
FIG. 7 is a flowchart illustrating a process to create a real usage model according to one embodiment.

FIG. 7 is a flowchart illustrating the process 330 shown in FIG. 3 to create a real usage model according to one embodiment.

Upon START, the process 330 associates the environmental profile with the usage profile (Block 710). As discussed above, this association is to express one parameter in one profile as a function of another parameter in the same profile or in another profile. For example, the garbage collection parameter may be represented as a function of the environmental data. As an illustrative example, the average number of garbage collections may be expressed as function of temperature Next, the process 330 computes deviations from the initial usage model (Block 720). These deviations show how much the real usage differ from the theoretical usage so that predictions may be properly adjusted. Then, the process 330 forms a parametric expression using at least one of the statistics of the SSD operations, the operation rate and/or the operation frequency, the associated environmental profile, and the deviations (Block 730). The parametric expression may include a number of expressions in which one parameter is expressed as function of one or more parameters. For example, the average number of static wear leveling may be expressed as a function of temperature, type of the SSD, and time. The process 330 is then terminated.

Figure 8:
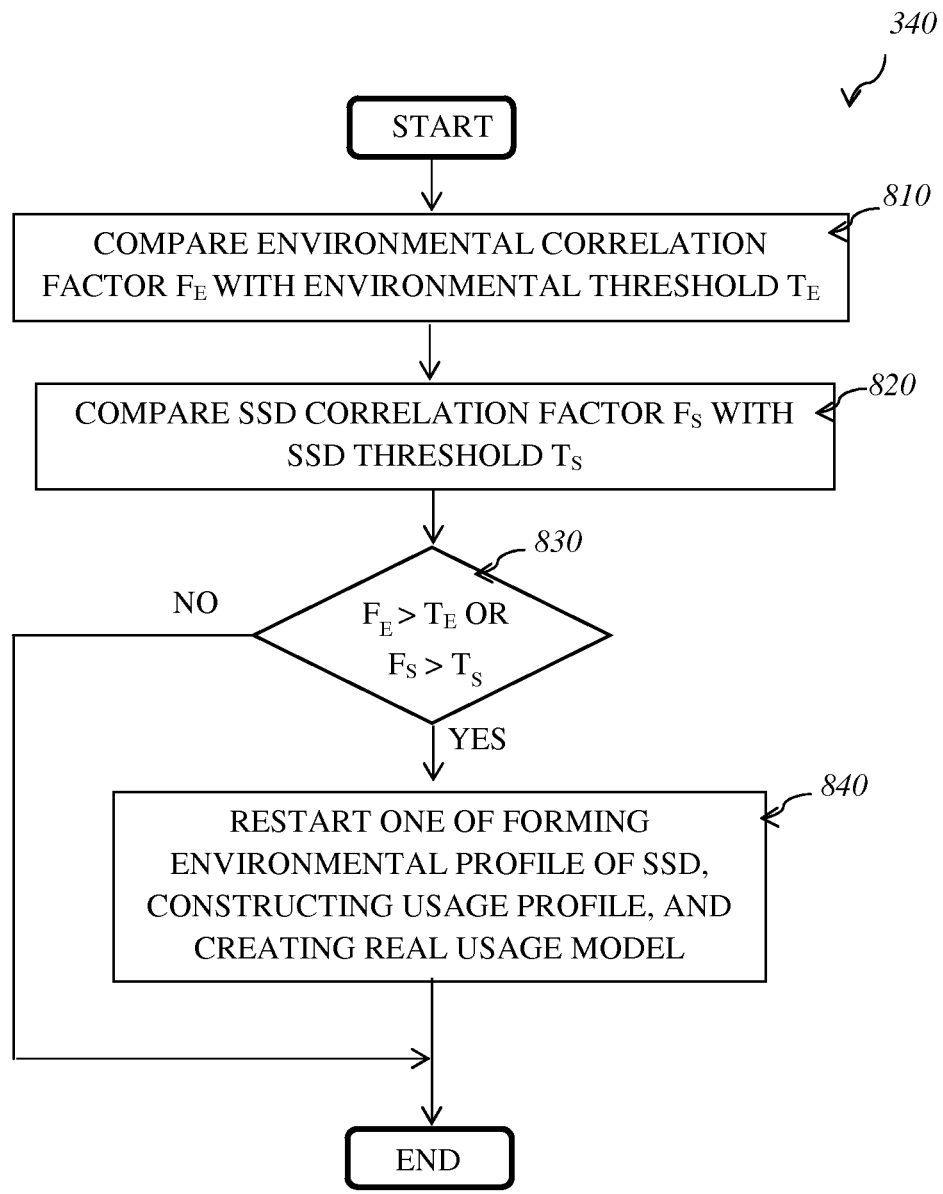
FIG. 8 is a flowchart illustrating a process to update the real usage model according to one embodiment.

FIG. 8 is a flowchart illustrating the process 340 shown in FIG. 3 to update the real usage model according to one embodiment.

Upon START, the process 340 compares the environmental correlation factor $F_E$ with an environmental threshold $T_E$ (Block 810). Next, the process 340 compares the SSD correlation factor $F_S$ with an SSD threshold $T_S$ (Block 820). Then, the process 340 determines if $F_E>T_E$ or $F_S>T_S$ (Block 830). If so, the process 340 restarts one of forming the environmental profile of the SSD, constructing the usage profile of the SSD, and creating a real usage model for the SSD (Block 840). For example, if $F_E>T_E$, it indicates that there is a significant change in the environment and the process should update the real usage model by restarting forming the environmental profile of the SSD (e.g., perform Block 310). Similarly, $F_S>T_S$, it indicates that there is a significant change in the SSD operations and the process should update the real usage model by restarting constructing the usage profile of the SSD (e.g., perform Block 320). The process 340 is then terminated.

The real usage model is useful in many situations. It may be used to estimate the lifespan of the SSD 112 and therefore it may be used to predict failures. It may also be used to adjust the behavior of the SSD subsystem to adapt to the current environment to lengthen or extend the lifespan.

The real usage model allows the system to develop a set of optimal SSD operations that are designed to extend the lifespan of the SSD. Traditional techniques to do this do not take into account the actual environment and/or actual usage. Therefore, traditional technique may not be accurate, wasteful and may be inefficient. The real usage model allows the system to learn about the actual environment and actual usage of the SSD. The set of optimal SSD operations therefore reflect more accurate optimization.

Figure 9:
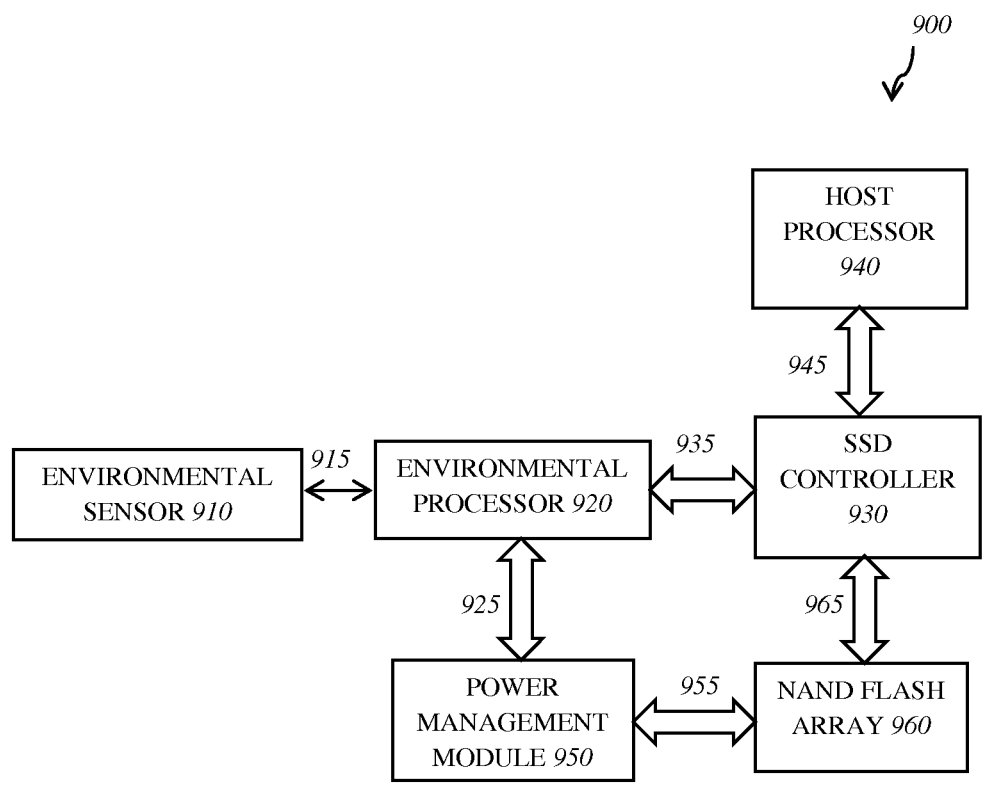
FIG. 9 is a diagram illustrating an environmental subsystem according to one embodiment.

FIG. 9 is a diagram illustrating an environmental subsystem 900 according to one embodiment. The environmental subsystem 900 may have similar components as in the system 100. It includes an environmental sensor 910, an environmental processor 920, an SSD controller 930, a host processor 940, a power management module 950, and a NAND flash array 960.

The environmental sensor 910 is similar to the environmental sensor 130 shown in FIG. 1. It may be a single sensor or a set of several sensors of the same type or of different types. The sensor or sensors may be located at any locations suitable for the creation of the real usage model. It may be an environmental sensor being at least one of a temperature sensor, a power sensor, a timing unit, a humidity sensor, a pressure sensor, and an illuminance sensor. The temperature sensor measures the ambient temperature. The power sensor may monitor the power consumption by the subsystem or by the NAND flash array 960 and provides power parameters such as current consumption or power consumption. The timing unit provides the timing information including time of day. The humidity sensor measures the humidity of the environment. The pressure sensor measures the pressure of the environment, including the air pressure. The illuminance sensor measures the illuminance or the brightness of the environment. It may include calibration circuitry to allow self-calibration when necessary, such as when it has been used for an extended period. It may include analog circuits for signal conditioning, amplification, noise filtering, and programmable gain. It may include analog-to-digital (A/D) converter to convert the sensed analog signal to digital data. It may include control circuitry to control the operation of the sensor such as setting the gain, start and stop A/D conversion, etc. The environmental sensor 910 communicates with the environmental processor 920 via a communication path 915. The communication path 915 may be wired or wireless. It may be unidirectional (e.g., from the sensor 910 to the environmental processor 920) or bidirectional (e.g., to and from the environmental processor 920). It may receive command and data from the environmental processor 920.

The environmental processor 920 may be any programmable processor that executes instructions to perform a task. It is similar to usage monitor 120 shown in FIG. 1. It may be a single-chip microcontroller having on-board memory and I/O devices. It may receive data from the environmental sensor 910 via the communication path 915. The data may include the sensed data such as the ambient temperature. It may send command and control information to the environmental sensor 910 to control the operation of the sensor in the environmental sensor 910. It may execute a number of tasks pertinent to environmental sensing, data analysis, etc. It may generate information needed for the estimation of lifespan and/or behavior adaptation of the NAND flash array 960. It communicates with the SSD controller via a communication pathway 925 which may be wired or wireless or a combination of wired and wireless. The environmental processor 920 may exchange control information with the SSD controller 930 via the communication pathway 925.

The SSD controller 930 is similar to the SSD processor 114 shown in FIG. 1. It may communicate with the host processor 940 via a communication pathway 945 and the power management module 950 via a communication pathway 955. The SSD controller 930 may perform the tasks of lifespan estimation and behavior adaptation or it may share these tasks with the environmental processor 920. The SSD controller 930 may have direct access to the NAND flash array 960 via a communication pathway 935.

The host processor 940 is similar to the host processor 116 shown in FIG. 1. It may be general-purpose or special-purpose microprocessors. It may communicate with the SSD controller 930 via a communication pathway 945. It typically performs reads from, and writes to, the NAND flash array 960 through the SSD controller 930. It may also read SMART data including SMART attributes for the NAND flash array 960. These attributes may include read error rate; throughput performance; estimated remaining life based on start/stop count, power-on hours count; erase program cycle; program fail count; erase fail count; wear leveling count; hardware ECC recovered; write error rate; soft read errors; etc.

The power management module 950 may perform a variety of power management tasks including control of power up/down sequence, sudden power loss, standby power, etc. It may receive commands from the environmental processor 920 and report status via the communication pathway 925. The power management module 950 may perform control functions on the NAND flash array 960 to adapt the behavior of the subsystem to enhance the useful life of the NAND flash array 960 based on the analysis carried out by the environmental processor 920.

The NAND flash array 960 is similar to the SSD 112 shown in FIG. 1. It may include an array of flash memory devices. The environmental processor 920 may estimate the lifespan of the NAND flash array 960 based on the environmental conditions and the usage (e.g., writes, erase cycles) of the NAND flash array 960. The environmental processor 920 may modify the system behavior that may affect the life of the NAND flash array 960.

Figure 10:
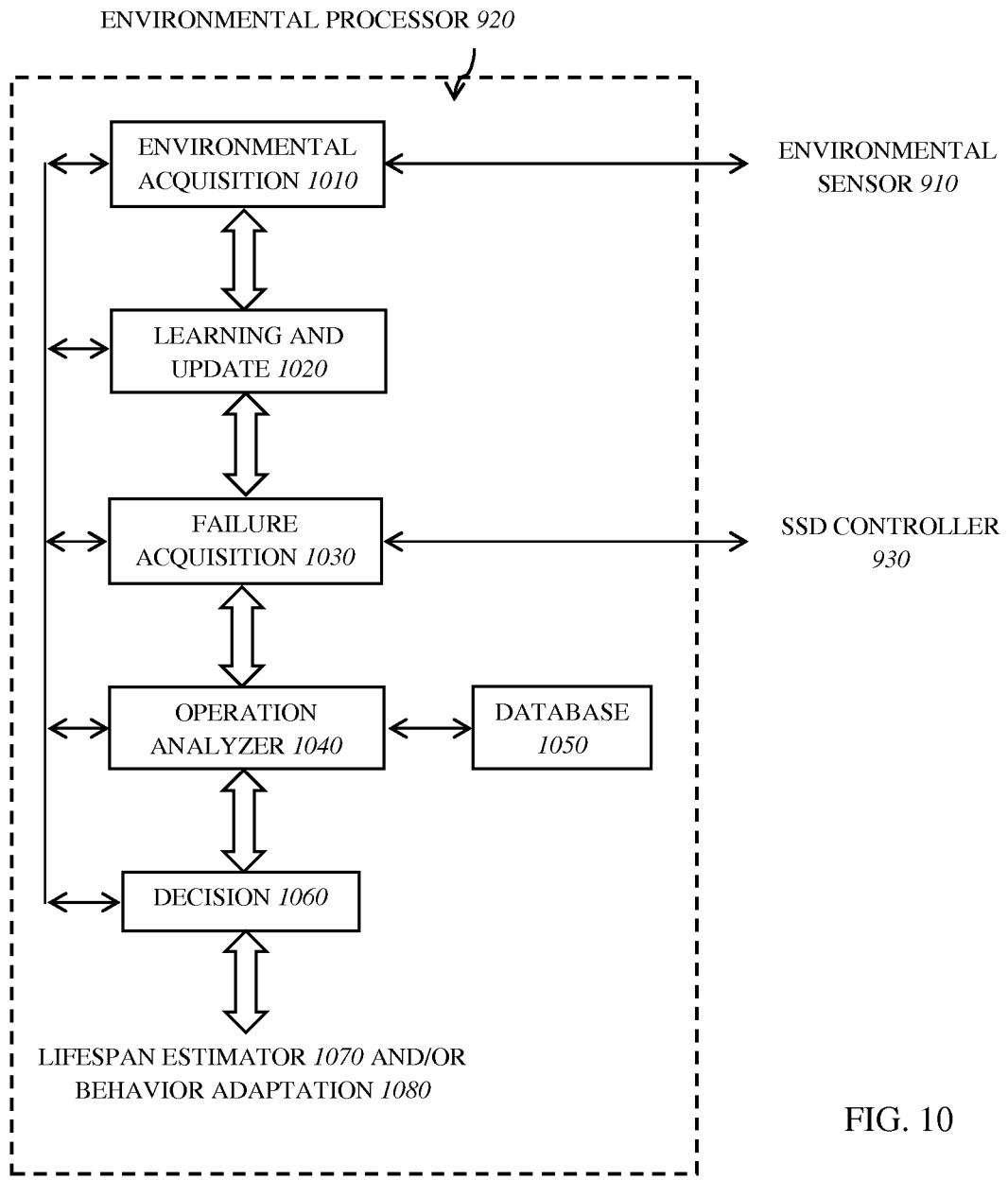
FIG. 10 is a diagram illustrating an environmental processor according to one embodiment.

FIG. 10 is a diagram illustrating the environmental processor 920 shown in FIG. 9 according to one embodiment. The environmental processor 920 may have memory that stores program instructions that, when executed by the environmental processor 920, cause the environmental processor 920 perform operations described elsewhere in this disclosure. These program instructions may form into modules or functions having specific functionalities. These modules or functions may also be realized by dedicated hardware or firmware components. The term "module" here, therefore, may refer to a software or firmware components, or a hardware circuit. In addition, one or more of these modules may be performed by the SSD controller 930. The environmental processor 920 may include several modules including an environmental acquisition module 1010, a learning and update module 1020, a failure acquisition module 1030, an operation analyzer 1040, a database 1050, and a decision module 1060. These modules are interconnected to form a processing flow that processes the information from the environmental sensor 910 and the SSD controller 930.

The environmental acquisition module 1010 acquires the environmental information from the environmental sensor 910. Multiple values of the measurements from multiple sensors may be obtained.

The learning and update module 1020 receives the environmental information provided by the environmental acquisition module 1010. From the environmental information, the learning and update module 1020 may learn about the environment and constructs an environmental profile of the environment in which the subsystem is operating. For example, it may construct a temperature profile as a function of time. By accumulating sensor information over a period of time, it may be able to derive an expression that describes the sensor profile with respect to a parameter such as time. The learning and update module 1020 updates the environmental profile whenever there is a new stream of sensor data or when there is a significant change. By learning and updating the environment, the learning and update module 1020 provides useful information for subsequent analyses. For example, the learning and update module 1020 may detect a significant deviation from the normal power profile and this information may be useful to control the power management module 950 to generate appropriate commands to the NAND flash array 960.

The failure acquisition module 1030 receives the SSD failure data from the SSD controller 930 and the environmental information as processed by the learn and update module 1020. The SSD failure data may include information that indicates a failure in the NAND flash array 960 as collected by the SSD controller 930. These failure data may include program/erase failure, read/write failures, number of ECCs, etc. These failure data may be tagged, correlated, or associated with the environmental information received from the learn and update module 1020. The data may be collected in a form of raw data expressed in tabular forms.

The operation analyzer 1040 receives the SSD failure data that are associated with the environmental information and analyzes the information in conjunction with the information provided by the database 1050. For example, the operation analyzer 1040 may identify a large number of failures at the time of high power consumption or high temperature. By comparing the actual failure data in the actual environment with the pre-computed data or model data stored in the database 1050, the operation analyzer 1040 may be able to extrapolate, interpolate, or compensate the failure data to determine an accurate failure mode of the NAND flash array 960.

The database 1050 stores pre-determined information to be used by the operation analyzer 1040. The pre-determined information may include various constants, thresholds, or coefficients that may be used. It may also store theoretical or empirical models, expressions, formulas, or algorithms related to the failure modes. These models, expressions, formulas, or algorithms may be provided by manufacturers of the NAND flash array 960, third-party vendors, or others.

The decision module 1060 receives the failure information as analyzed and computed by the operation analyzer 1040 and determines if this information is sufficiently reliable. The reliability of the information may be determined by several factors such as the time period over which the failure information is analyzed, the amount of data, the consistency of the results, etc. Based on this reliability analysis, the decision module 1060 may generate a decision regarding the use of the failure information. The decision may be to continue accumulate data, to adjust certain parameters in any of the modules, to isolate one or more modules from the processing chain, or to accept the information as valid. The decision module 1060 may send appropriate command to one or more of the environmental acquisition module 1010, the learning and update module 1020, the failure acquisition module 1030, and the operation analyzer 1040. If the decision is to accept the information as valid, the decision module 1060 may pass the information to subsequent modules for follow-up actions such as lifespan estimation and/or behavior adaptation.

Figure 11:
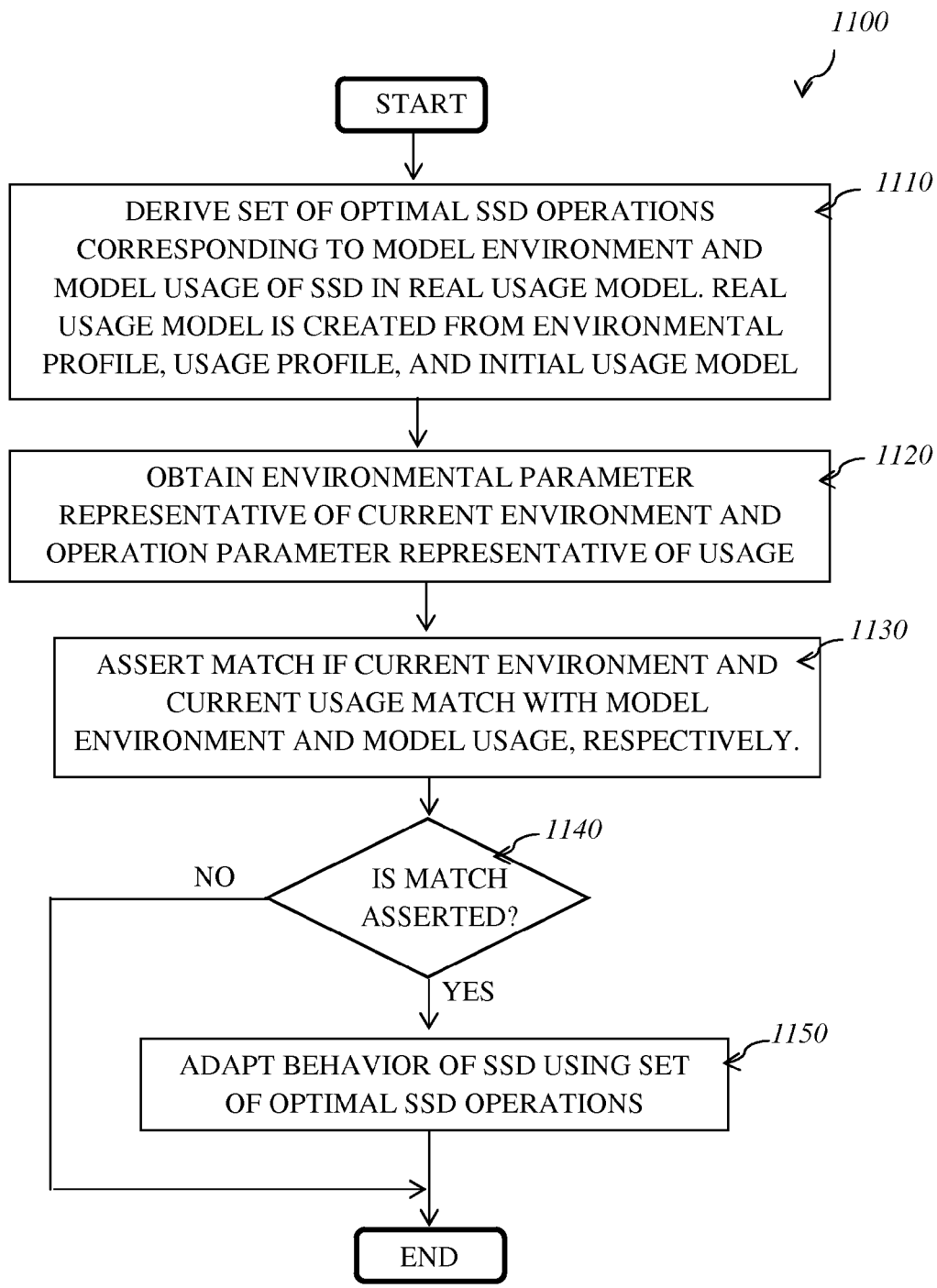
FIG. 11 is a flowchart illustrating a process to adapt behavior of the SSD according to one embodiment.

FIG. 11 is a flowchart illustrating a process 1100 to adapt behavior of the SSD according to one embodiment.

Upon START, the process 1100 derives a set of optimal SSD operations corresponding to a model environment and a model usage of a SSD in a real usage model (Block 1110). As discussed above, the real usage model is created from an environmental profile, a usage profile, and an initial usage model. The model environment is the environment where a set of optimal SSD operations may be performed. For example, during the construction of the real usage model, it has been observed that when the temperature is between 27° C. to 30° C. and the humidity level is above 80% during the time from 11:00 AM to 3:00 PM, there are many short random writes to the SSD. Accordingly, an optimal SSD operation may be performed by directing these short random writes to a buffer instead of the SSD and later these writes may be consolidated and transferred to the SSD. This way, there will be less data collection and the SSD lifespan may be extended. Similarly, the model usage is the SSD usage where a set of optimal SSD operations may be performed. Block 910 may be performed while the real usage model is being constructed and this operation may be extended throughout the life of the SSD. In other words, the set of optimal SSD operations are constantly derived and stored in the real usage model.

Next, the process 1100 obtains an environmental parameter representative of a current environment and a usage parameter representative of a current usage of the SSD (Block 1120). This operation is to determine if the environment and/or the SSD usage is such that the SSD's behavior may be adapted. Then, the process 1100 asserts a match if the current environment and the current usage match with the model environment and the model usage, respectively (Block 1130).

Next, the process 1100 determines if the match is asserted (Block 1140). If not, the process 1100 is terminated. Otherwise, the process 1100 adapts behavior of the SSD using the set of optimal SSD operations (Block 1150) and is then terminated.

Figure 12:
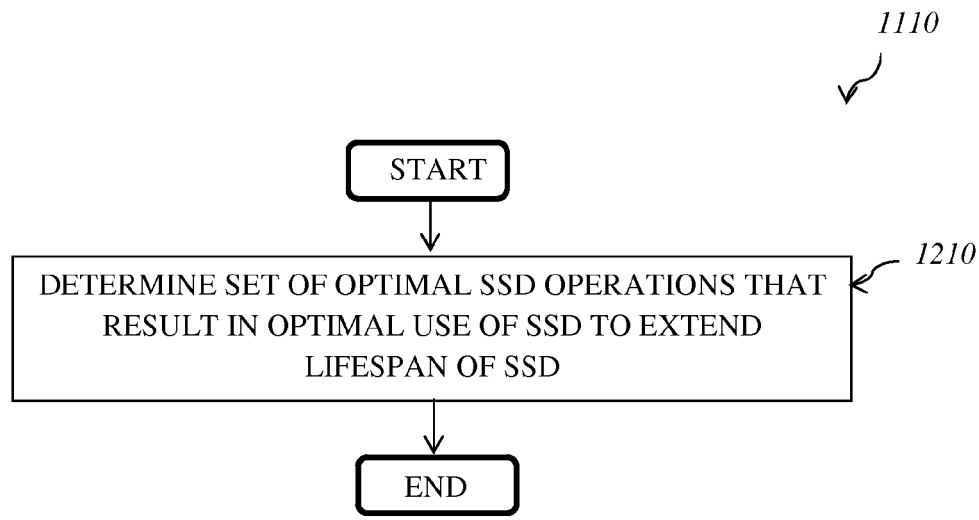
FIG. 12 is a flowchart illustrating a process to derive a set of SSD operations according to one embodiment.

FIG. 12 is a flowchart illustrating the process 1110 shown in FIG. 11 to derive a set of SSD operations according to one embodiment.

Upon START, the process 1110 determines the set of optimal SSD operations that result in optimal use of the SSD to extend lifespan of the SSD (Block 1210). There are several ways to extend the lifespan of the SSD. One main technique is to reduce the number of program/erase cycles. For example, an optimal SSD operation may be to perform direct short random writes to a buffer to reduce fragmentation and therefore reduce the number of times data collection is performed. The process 1110 is then terminated.

Figure 13:
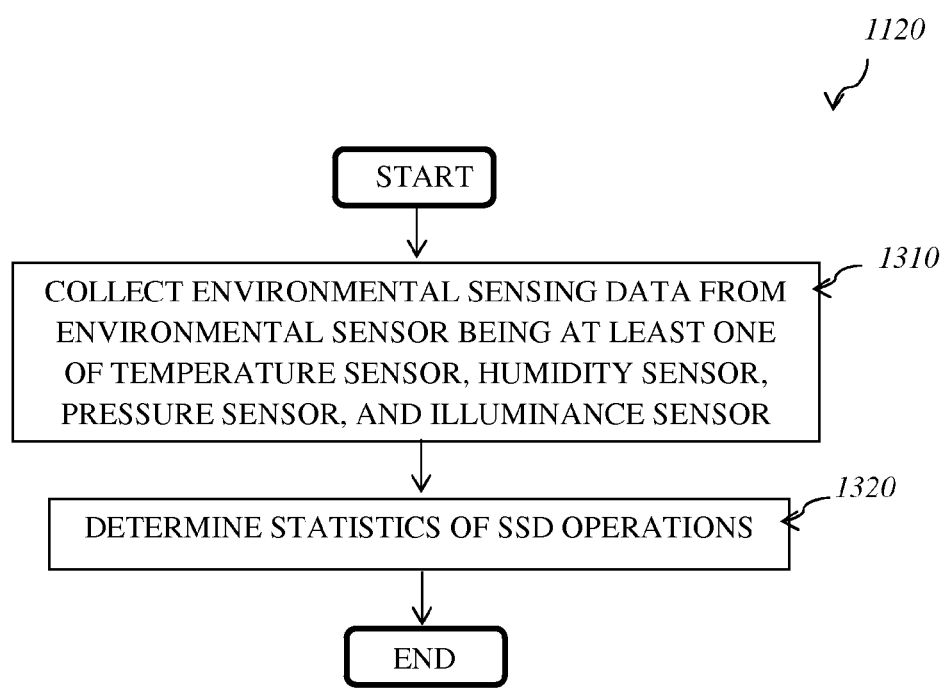
FIG. 13 is a flowchart illustrating a process to obtain environmental and operation parameters according to one embodiment.

FIG. 13 is a flowchart illustrating the process 1120 shown in FIG. 11 to obtain environmental and operation parameters according to one embodiment.

Upon START, the process 1120 collects environmental sensing data from an environmental sensor being at least one of a temperature sensor, a power sensor, a humidity sensor, a pressure sensor, and an illuminance sensor (Bock 1310). This operation is to obtain the current environment of the SSD. Next, the process 1120 determines statistics of SSD operations (Block 1320). As discussed above, the statistics may include the number of writes, the average number of wear leveling, etc. The process 1120 is then terminated.

Figure 14:
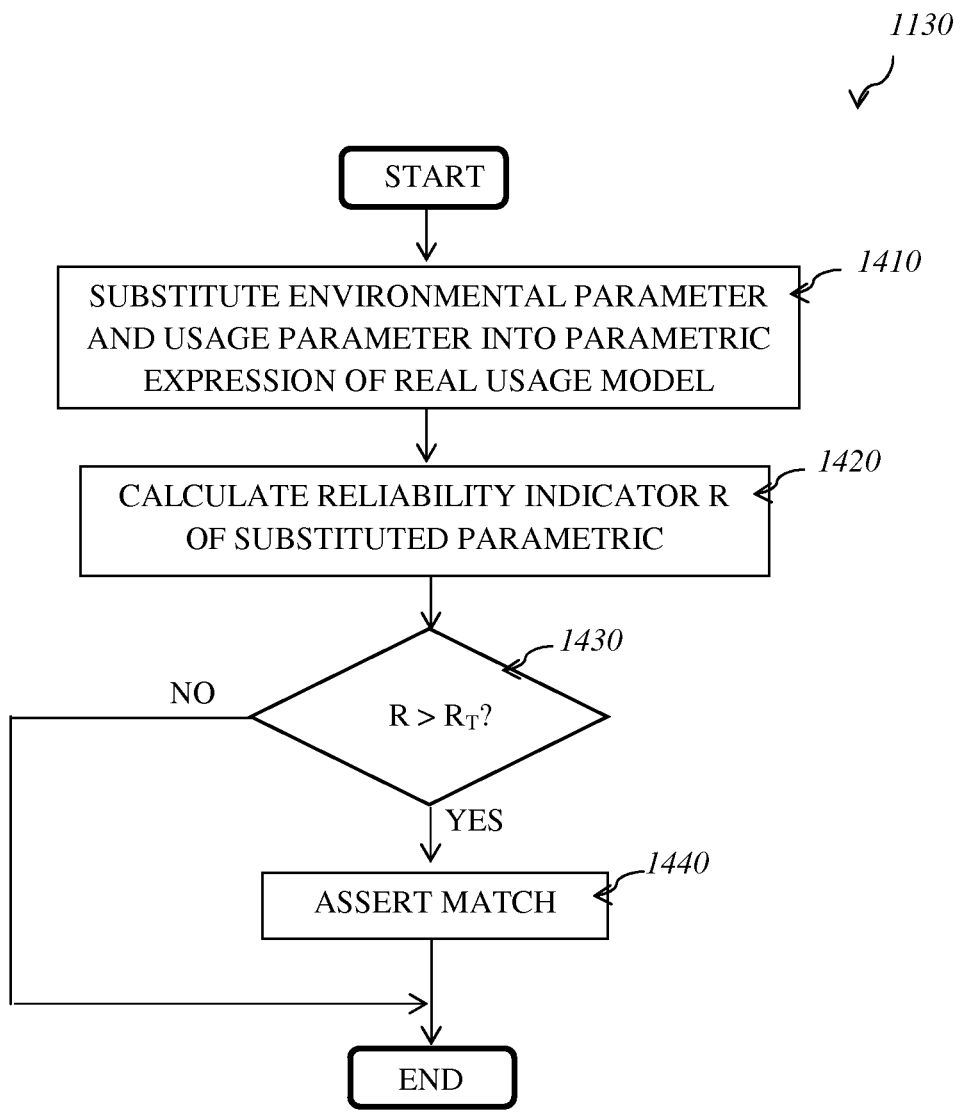
FIG. 14 is a flowchart illustrating a process to assert a match according to one embodiment.

FIG. 14 is a flowchart illustrating the process 1130 shown in FIG. 11 to assert a match according to one embodiment.

Upon START, the process 1130 substitutes the environmental parameter and the usage parameter into a parametric expression of the real usage model (Block 1410). As discussed above, the real usage model may have a set of parametric expressions that characterize the environment and the SSD usage. This expression characterizes the particular operations performed on the SSD at a particular environment. For example, the application may be a database application and heavy database operations may take place at the end of the day where data are merged and combined, transactions are reconciled and data are stored, etc. A parametric expression may characterize the number of writes to consecutive addresses at the end of the day. For this type of operations, an optimal SSD operation may be derived. For example, writes may be performed on the over-provisioned blocks instead of the normal blocks.

Next, the process 1130 calculates a reliability indicator of the substituted parametric expression (Block 1420). The reliability indicator is a number that indicates how reliable the decision to adapt the behavior. It may be the probability that a particular value of the parametric expression corresponds to a derived set of optimal SSD operations. For example, in the above database example, if the scenario that the number of writes to consecutive addresses occurring toward the end of the day has been observed consistently for many days, then the probability that this scenario is indeed a routine scenario is very high. Accordingly, if the reliability indicator is high, then a behavior adaptation may be allowed. Therefore, the process 1130 asserts the match if the reliability indicator exceeds a reliability threshold (Block 1430). The process 1130 is then terminated.

Figure 15:
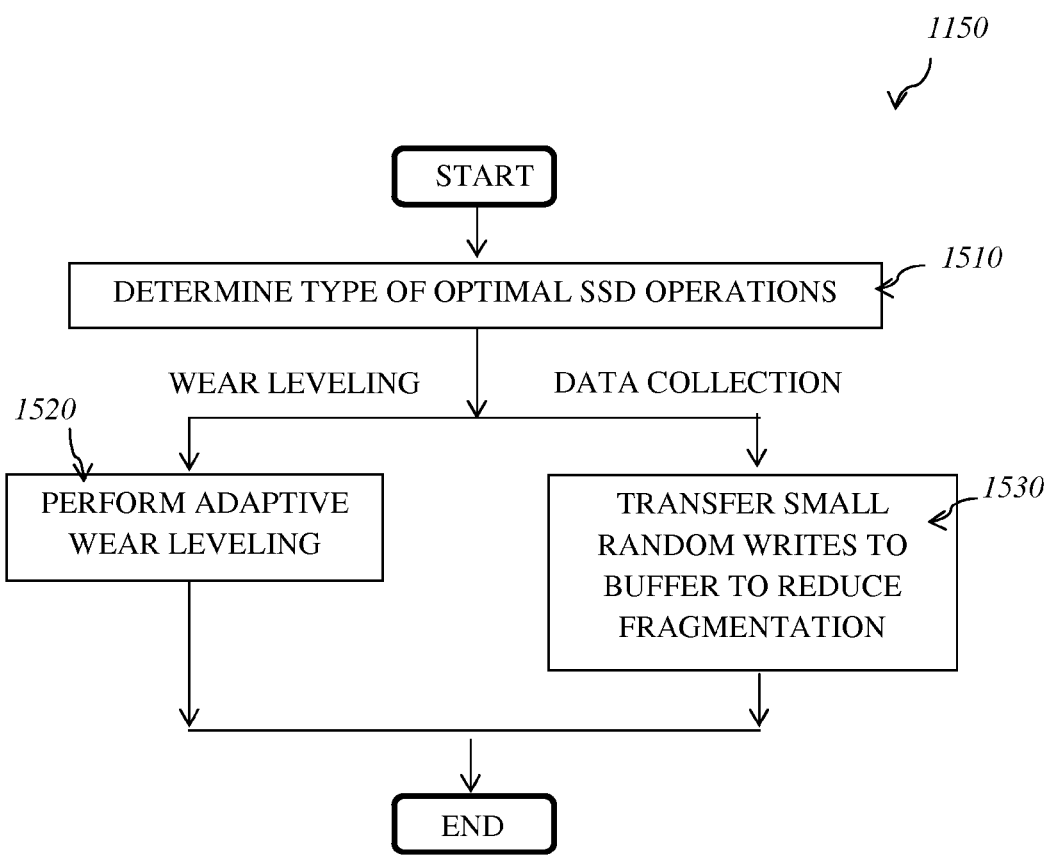
FIG. 15 is a flowchart illustrating a process to adapt behavior of the SSD using the set of optimal SSD operations according to one embodiment.

FIG. 15 is a flowchart illustrating the process 1150 shown in FIG. 11 to adapt behavior of the SSD using the set of optimal SSD operations according to one embodiment.

Upon START, the process 1150 determines the type of optimal SSD operations (Block 1510). There may be several types of optimal SSD operations. In this illustrative example, it is assumed that two types are available: adaptive wear leveling and data collection. If it is wear leveling, the process 1150 performs an adaptive wear leveling (Block 1520) and is then terminated. An example of an adaptive wear leveling is to change adaptively the window size of a block of logical addresses to determine whether the data is dynamic or static. The window size may be changed as a function of remaining lifespan. The shorter the remaining lifespan, the shorter the window size.

If the type is data collection, the process 1150 transfers small random write operations to a buffer to reduce fragmentation (Block 1530). The process 1150 is then terminated.

Figure 16:
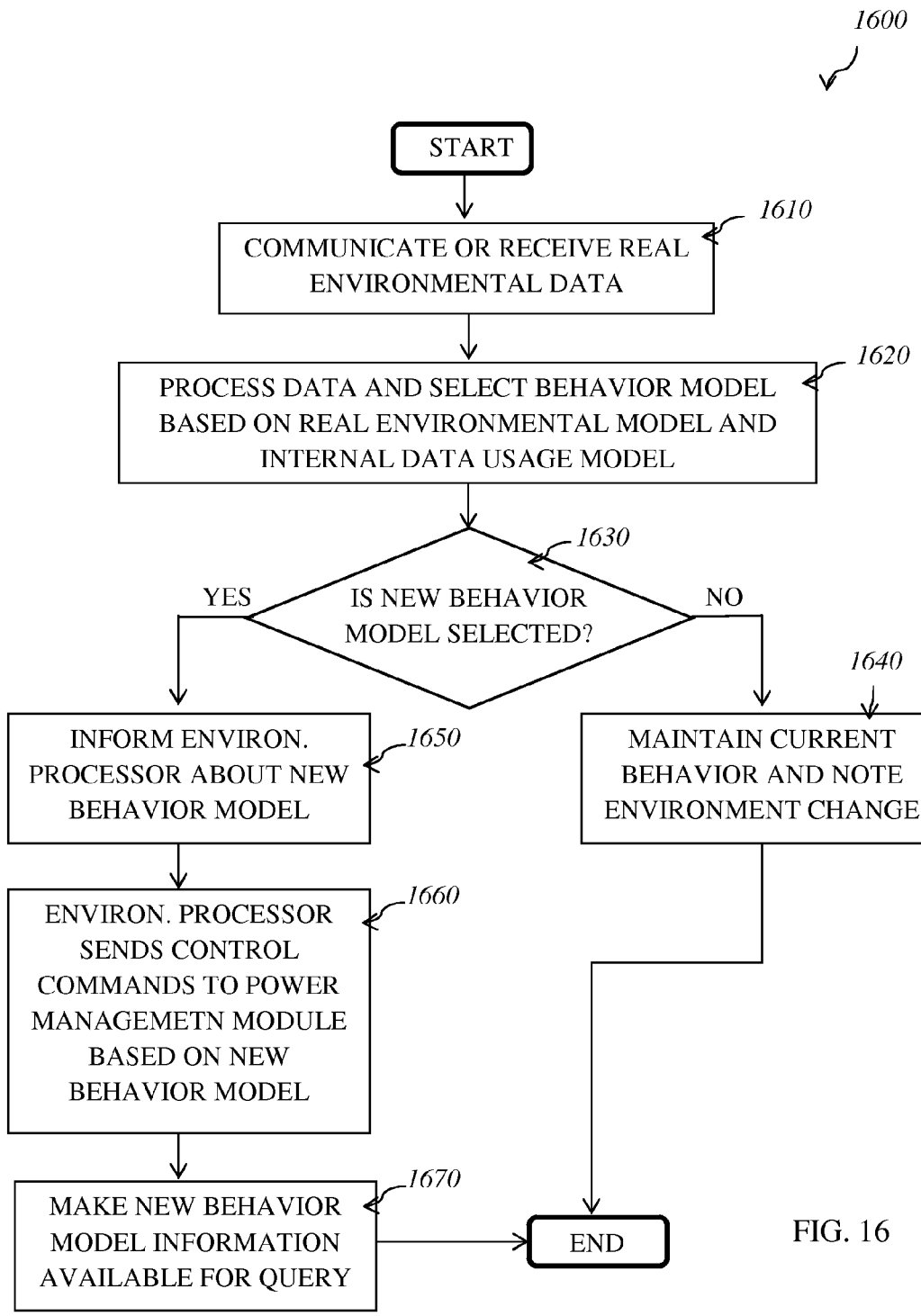
FIG. 16 is a flowchart illustrating a process to adapt behavior of the SSD using according to another embodiment.

FIG. 16 is a flowchart illustrating a process 1600 to adapt behavior of the SSD using according to another embodiment. The process 1600 may correspond to the embodiments shown in FIGS. 9 and 10. The usage model and behavior adaptation as described above may also be employed.

Upon START, the process 1600 communicates or receives the real environmental data (Block 1610). The real environmental data may be transferred from the environmental processor 920 to the SSD processor 930 as shown in FIG. 9 if the SSD processor is responsible for perform behavior adaptation. Alternatively, if the environmental processor 920 is responsible for behavior adaptation, it may maintain the real environmental data.

Next, the process 1600 processes data and selects a behavior model based on the real environmental model and an internal data usage model (Block 1620). The environmental model and/or the internal data usage model may be described as above. Then, the process 1600 determines if a new behavior model is switched or selected (Block 1630). If not, the process 1600 maintains the current behavior and notes the environment change (Block 1640) and is then terminated.

If a new behavior model is selected, the process 1600 informs the environmental processor about the new behavior model (Block 1650). Next, the environmental processor sends control commands to the power management module based on the new behavior model (Block 1660). The power management module then applies a new power policy corresponding to the new behavior model. Depending on the real environment as obtained and the current usage of the SSD, the new power policy may include suitable operations. For example, the refresh rate of the NAND flash array may be changed. In addition, other operations that may affect the lifespan of the SSD and data integrity and retention may be carried out according to the new behavior model. These operations may include the frequency of wear leveling or garbage collection. For data integrity and retention, the power may not be turned off even in sleep mode under certain environment. Furthermore, any of the SSD optimal operations described above may be used to extend the lifespan of the SSD. Then, the process 1600 makes the new behavior model information available for query (Block 1670) and is then terminated. The query may be made via the SMART query commands issued by the host processor or any other suitable query processing.

Elements of one embodiment may be implemented by hardware, firmware, software or any combination thereof. The term hardware generally refers to an element having a physical structure such as electronic, electromagnetic, optical, electro-optical, mechanical, electro-mechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EPROM). Examples of firmware may include microcode, writable control store, micro-programmed structure. When implemented in software or firmware, the elements of an embodiment may be the code segments to perform the necessary tasks. The software/firmware may include the actual code to carry out the operations described in one embodiment, or code that emulates or simulates the operations. The program or code segments may be stored in a processor or machine accessible medium. The "processor readable or accessible medium" or "machine readable or accessible medium" may include any non-transitory medium that may store information. Examples of the processor readable or machine accessible medium that may store include a storage medium, an electronic circuit, a semiconductor memory device, a read only memory (ROM), a flash memory, an erasable programmable ROM (EPROM), a floppy diskette, a compact disk (CD) ROM, an optical disk, a hard disk, etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:
1. A method comprising:
    deriving a set of optimal solid-state drive (SSD) operations corresponding to a model environment and a model usage of a SSD in a real usage model, the real usage model being created from an environmental profile, a usage profile, and an initial usage model;
    obtaining an environmental parameter representative of a current environment and an usage parameter representative of a current usage of the SSD;
    asserting a match if the current environment and the current usage match with the model environment and the model usage, respectively; and
    adapting behavior of the SSD using the set of optimal SSD operations if the match is asserted.

2. The method of claim 1 wherein deriving comprises:
    determining the set of optimal SSD operations that result in optimal use of the SSD to extend lifespan of the SSD.
3. The method of claim 1 wherein obtaining comprises:
    collecting environmental sensing data from an environmental sensor being at least one of a temperature sensor, a humidity sensor, a pressure sensor, and an illuminance sensor; and
    determining statistics of SSD operations.
4. The method of claim 1 wherein asserting the match comprises:
    substituting the environmental parameter and the usage parameter into a parametric expression of the real usage model;
    calculating a reliability indicator of the substituted parametric expression; and
    asserting the match if the reliability indicator exceeds a reliability threshold.
5. The method of claim 3 wherein adapting the behavior comprises one of:
    performing an adaptive wear leveling; and
    transferring small random write operations to a buffer to reduce fragmentation.
6. A circuit comprising:
    a solid-state drive (SSD) processor coupled to an SSD;
    an environmental sensor to provide environmental sensing data; and
    a usage monitor coupled to the SSD processor and the environmental sensor to provide real usage environment information, the usage monitor comprising a usage processor and a memory coupled to the usage processor, the memory storing instructions that, when executed by the usage processor, cause the usage processor to perform operations comprising:
        deriving a set of optimal solid-state drive (SSD) operations corresponding to a model environment and a model usage of a SSD in a real usage model, the real usage model being created from an environmental profile, a usage profile, and an initial usage model,
        obtaining an environmental parameter representative of a current environment and an usage parameter representative of a current usage of the SSD,
        asserting a match if the current environment and the current usage match with the model environment and the model usage, respectively, and adapting behavior of the SSD using the set of optimal SSD operations if the match is asserted.
7. The circuit of claim 6 wherein the instructions causing the usage processor to perform deriving comprises instructions that cause the usage processor to perform operations comprising:
    determining the set of optimal SSD operations that result in optimal use of the SSD to extend lifespan of the SSD.
8. The circuit of claim 6 wherein the instructions causing the usage processor to perform deriving obtaining comprises instructions that cause the usage processor to perform operations comprising:
    collecting environmental sensing data from an environmental sensor being at least one of a temperature sensor, a humidity sensor, a pressure sensor, and an illuminance sensor; and
    determining statistics of SSD operations.
9. The circuit of claim 6 wherein the instructions causing the usage processor to perform asserting the match comprises instructions that cause the usage processor to perform operations comprising:

substituting the environmental parameter and the usage parameter into a parametric expression of the real usage model;
calculating a reliability indicator of the substituted parametric expression; and
asserting the match if the reliability indicator exceeds a reliability threshold.

10. The circuit of claim 8 wherein the instructions causing the usage processor to perform adapting the behavior comprises instructions that cause the usage processor to perform operations comprising one of:
performing an adaptive wear leveling; and
transferring small random write operations to a buffer to reduce fragmentation.

11. A method comprising:
receiving real environmental information from an environmental processor, the real environmental information corresponding to an environment of a solid-state drive (SSD);
choosing a behavior model based on a real environmental model and an internal data usage model;
if a new behavior model is chosen,
informing the environmental processor about the new behavior model,
sending control commands to a power management module to apply new power policy to the SSD, and
making information on the new behavior model available for query;
else
maintaining current behavior model.

* * * * *